United States Patent [19]

Iwata et al.

[11] Patent Number: 5,296,732
[45] Date of Patent: Mar. 22, 1994

[54] BIPOLAR TRANSISTOR

[75] Inventors: Hitoshi Iwata; Koichi Jinkai; Yasuo Imaeda, all of Aichi, Japan

[73] Assignee: Kabushiki Kaisha Tokai Rika Denki Seisakusho, Aichi, Japan

[21] Appl. No.: 29,966

[22] Filed: Mar. 9, 1993

Related U.S. Application Data

[63] Continuation of Ser. No. 317,410, Mar. 1, 1989, abandoned.

[30] Foreign Application Priority Data

Mar. 2, 1988 [JP] Japan .................. 63-49427

[51] Int. Cl.5 .................. H01L 29/40; H01L 29/72
[52] U.S. Cl. .................. 257/565; 257/579; 257/575
[58] Field of Search .............. 357/34, 36, 43; 437/31, 437/32

[56] References Cited

U.S. PATENT DOCUMENTS

| | | | |
|---|---|---|---|
| 3,576,476 | 4/1971 | Kerr | 357/36 |
| 3,582,723 | 6/1971 | Kerr | 357/36 |
| 3,746,949 | 7/1973 | Nienhuis et al. | 357/36 |
| 3,922,706 | 11/1975 | Kaiser | 357/36 |
| 3,946,425 | 3/1976 | Shoji et al. | 357/36 |
| 4,054,897 | 10/1977 | Fukuda | 357/36 |
| 4,104,785 | 8/1978 | Shiba et al. | 357/40 |
| 4,231,059 | 10/1980 | Hower et al. | 357/36 |
| 4,306,246 | 12/1981 | Davies et al. | 357/36 |
| 4,513,306 | 4/1985 | Davies | 357/36 |
| 4,586,072 | 4/1986 | Nakatari et al. | 357/36 |
| 4,656,496 | 4/1987 | Widlar | 357/36 |
| 4,680,608 | 7/1987 | Tsuzuki et al. | 357/36 |
| 4,783,690 | 11/1988 | Walden et al. | 357/36 |
| 4,792,839 | 12/1988 | Strack et al. | 357/36 |
| 4,831,281 | 5/1989 | Miller | 357/36 |

FOREIGN PATENT DOCUMENTS

| | | |
|---|---|---|
| 57-130465 | 8/1982 | Japan . |
| 57-181160 | 11/1982 | Japan .................. 357/68 |
| 0181160 | 11/1982 | Japan . |
| 59-215772 | 12/1984 | Japan . |
| 0177775 | 8/1986 | Japan . |
| 1-251657 | 10/1989 | Japan .................. 357/36 |

*Primary Examiner*—Eugene R. LaRoche
*Assistant Examiner*—Viet Q. Nguyen
*Attorney, Agent, or Firm*—Finnegan, Henderson, Farabow, Garrett & Dunner

[57] ABSTRACT

A bipolar transistor of the multi-emitter type which is provided with a large number of emitter diffusion layers formed in the two-dimensionally arranged state on a base diffusion layer of a substrate, a large number of emitter electrode films formed respectively correspondingly on the emitter diffusion layers, a base electrode film formed on the base diffusion layer, and a collector electrode film formed on the substrate, and the transistor is further provided with a wiring film commonly connected to the large number of emitter electrode films except at least one of the emitter electrode films.

13 Claims, 3 Drawing Sheets

BIPOLAR TRANSISTOR

This application is a continuation of application Ser. No. 07/317,410 filed Mar. 1, 1989, now abandoned.

BACKGROUND OF THE INVENTION

The present invention relates to a bipolar transistor of the multi-emitter type, and more particularly to a bipolar transistor suitable for use for detection of a load current flowing in a load when the transistor performs by itself on/off control of current conduction to the load.

When on/off control of current conduction to a load is performed by a bipolar transistor, it is desirable that the transistor is arranged so that the transistor is protected from a thermal breakdown due to and overload current. Therefore, conventionally, such a bipolar transistor has been designed so as to have a circuit arrangement as shown in FIG. 1. That is, in FIG. 1, a bipolar transistor 1 is so arranged as to be turned on/off on the basis of the control output of a base control circuit 2. A load 3 is supplied with a current from a power source terminal 4 according to the transistor 1. Further, a current detection resistor 5 is provided in a current conduction path to the load 3, a current detection circuit 6 is provided for detecting a current flowing in the load 3 (and hence a collector current Ic of the transistor 1) by sampling a voltage across the resistor 5. The base control circuit 2 turns off the transistor 1 in the condition where the current detected by the current detection circuit 6 exceeds a predetermined upper limit value Imax, so that the collector current Ic of the transistor 1 is prevented from exceeding the upper limit value $I_{max}$.

In such a configuration, the amount of heat generating in the resistor 5 increases corresponding to the load current Ic flowing in the transistor 1 and, therefore, not only a power loss in the resistor 5 increases but there is a possibility that the whole arrangement becomes large-scaled because it is necessary to use a large-scaled resistor having a large power capacity as the resistor 5. That is, for example, when the rated value of the load current Ic is 10 A and the value of the resistor 5 is 0.01 ohm, a voltage drop across the resistor 5 is 0.1 V and, accordingly, the resistor 5 is required to have a power capacity of 1 W at the lowest.

SUMMARY OF THE INVENTION

The present invention has been attained in view of the above problems accompanying the conventional device. More specifically, an object of the invention is to provide a bipolar transistor suitable for use in a case where it is necessary to detect a current flowing in a load when on/off control of current conduction to the load is performed, and in which a power loss due to the load current detection can be suppressed and accuracy in the current detection etc. can be improved.

The foregoing and other objects have been achieved by the provision of a bipolar transistor of the multi-emitter type which, according to the present invention, is provided with a large number of emitter diffusion layers formed in the two-dimensionally arranged state on a base diffusion layer of a substrate, a large number of emitter electrode films formed respectively correspondingly on the emitter diffusion layers, a base electrode film formed on the base diffusion layer, and a collector electrode film formed on a rear surface of the substrate, and the transistor is further provided with a wiring film commonly connected to the large number of emitter electrode films except at least one of the emitter electrode films.

Further, according to another aspect of the present invention, the bipolar transistor of the multi-emitter type is provided with a large number of emitter diffusion layers formed in a two-dimensionally arranged state on a base diffusion layer formed on a substrate, a large number of emitter electrode films formed on the emitter diffusion layers respectively, a base electrode film formed on the base diffusion layer and being provided with hole portions formed like meshes so that the hole portions respectively correspondingly surround the emitter electrode films, and a collector electrode film formed on a rear surface of the substrate, and the transistor is further provided with an inter-layer insulating film formed so as to cover the base electrode film and having through holes formed at portions respectively corresponding to the emitter electrode films, and a wiring film formed on the layer insulation film so that the wiring film is commonly connected through the respective through holes to the number of emitter electrode films except at least one of the special emitter electrode films.

For example, when on/off control of current conduction to a load is performed, the load current flows through divided current paths respectively constituted by the large number of emitter electrode films. That is, a part of the load current flows in the at least one special emitter electrode film and while the remainder part of the load current flows in the group of the remainder emitter electrode films commonly connected to the wiring film in the divided conditions with a ratio of division corresponding to the number of the emitter electrode films.

Accordingly, if a current sampling resistor is connected to the specific emitter electrode film assigned a small quantity of divided current as described above when the load current is to be detected, the power capacity of the resistor can be made sufficiently small. In this case, particularly, if the mesh-like base electrode film, the inter-layer insulation covering the base electrode film, and the wiring layer formed on the inter layer insulation film are provided, that is, if a so-called double-layer wiring structure is used, the wiring capacity of the base electrode film can be made extremely large.

Therefore, the voltage drop across the base electrode film can be made small, and the current density in the wiring film can be averaged, so that the load current flowing in the respective emitter electrode films can be made uniform to thereby improve the accuracy in current detection.

DESCRIPTION OF THE PREFERRED EMBODIMENTS

Preferred embodiments of the present invention will now be described with reference to accompanying drawings.

Figure 1:
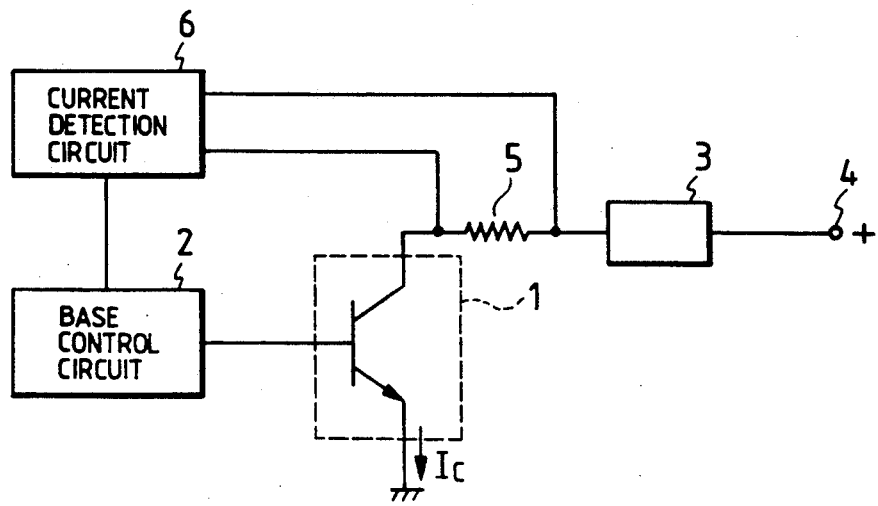
FIG. 1 is a diagram showing a conventional circuit arrangement employing a bipolar transistor.
Figure 2:
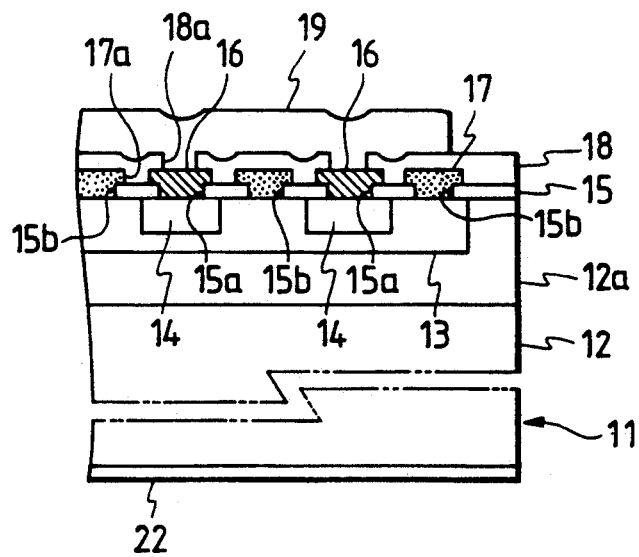
FIG. 2 is a diagram showing a sectional model structure of the main portion of the chip constituting the transistor according to the present invention.
Figure 3:
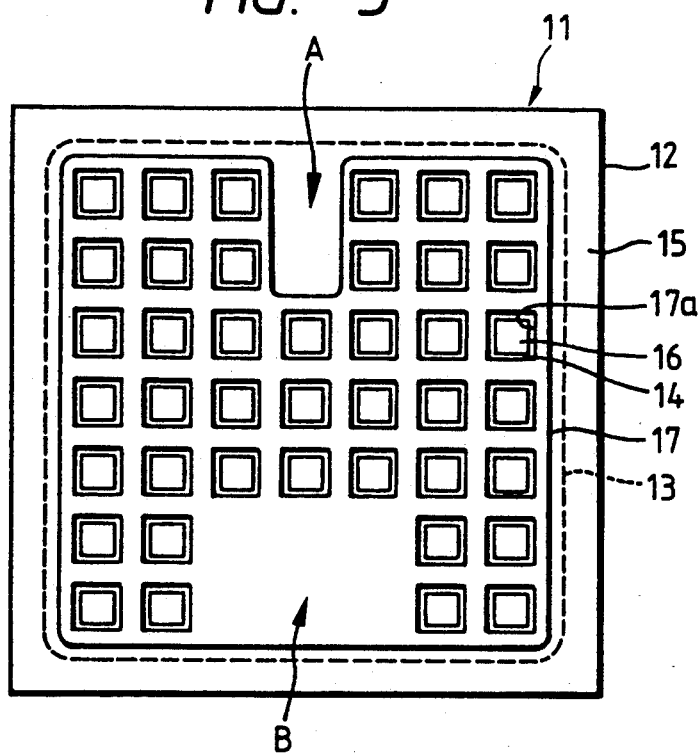
FIG. 3 is a plan view showing the chip in the condition where the wiring film and the inter-layer insulation film are removed.

FIG. 2 shows, in section, a model structure of a chip 11 constituting an NPN bipolar transistor of the multi-emitter type (hereinafter simply referred to as "transistor"). That is, in FIG. 2, the chip is provided with an N-type rectangular substrate 12 of an about 4 mm square, an epitaxial growth layer 12a formed on the upper surface of the substrate, a rectangular base diffusion layer 13 (P-type) formed by diffusing impurities (acceptors) in the epitaxial growth layer 12a substantially on an entire region of the latter. The chip 11 further includes a large number of emitter diffusion layers 14 (N-type) (forty-one in this embodiment) formed in a two-dimensional arrangement as shown in FIG. 3 by diffusing impurities (donors) in the base diffusion layer 13. Impurities are diffused in advance in the substrate 12 (on the epitaxial growth layer 12a and on the base diffusion layer 13) through diffusion windows 15a formed in an oxide film 15. A large number of emitter electrode films 16 are made of, for example, a material of aluminum series. Those emitter electrode films are formed on the respective emitter diffusion layers 14 through the diffusion windows 15a.

Contact holes 15b are formed through the oxide film 15 at its portions corresponding to the base diffusion layer 13 thereby communicating with each other and surrounding the respective emitter diffusion layers 14. A base electrode film 17 of, for example, a material of aluminum series is formed on the base diffusion layer 13 through the respective contact holes 15b substantially on an entire region of the base diffusion layer 13. The base electrode film 17 may form like meshes with hole portions 17a so that the hole portions 17a surround the respective emitter electrode films 16, as shown in FIG. 3. Further, tow regions A and B having no emitter electrode films 16 are formed on the epitaxial growth layer 12a as shown in FIG. 3. Of those regions A and B, even the base electrode film 17 is not formed on the region A.

Figure 4:
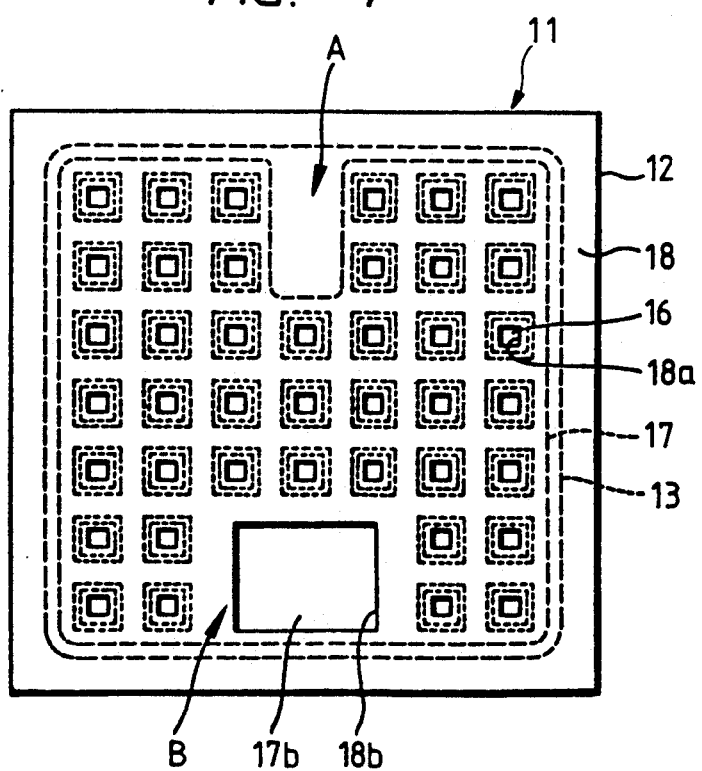
FIG. 4 is a plan view showing the chip in the condition where only the wiring film is removed.
Figure 5:
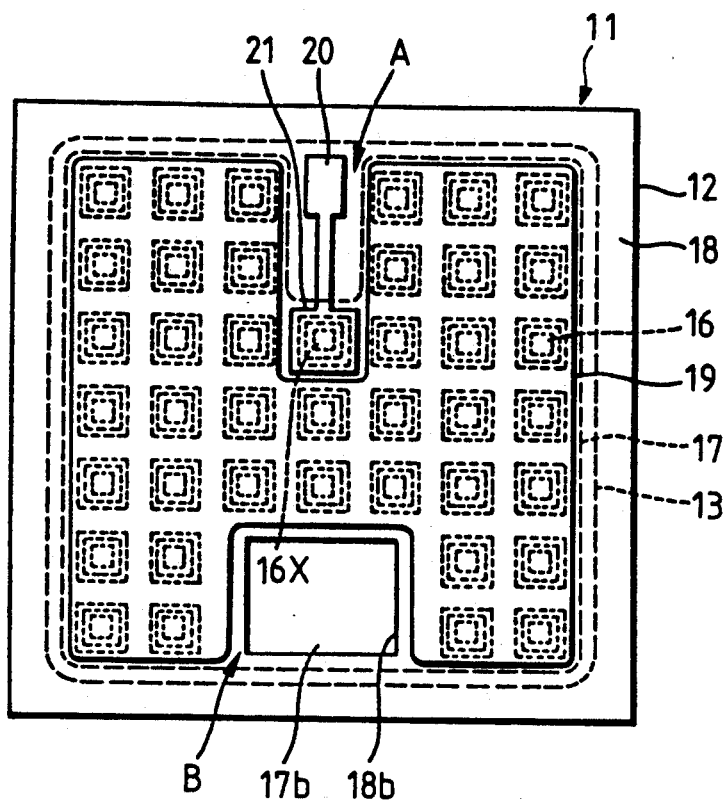
FIG. 5 is a plan view showing the chip.

An inter-layer insulation film 18 is formed on the entire surface of the substrate 12 for covering the base electrode film 17, the oxide film 15, and the like, the inter-layer insulation film 18 being provided with through holes 18a at portions corresponding to the respective emitter electrode films 16 and further provided with an opening 18b at a portion corresponding to the region B as shown in FIG. 4. Since the opening 18b is formed as described above, a portion of the base electrode film 17 facing the outside through the opening 18b functions as a bonding pad 17b (FIGS. 4 and 5). The inter-layer insulation film 18 may be formed of a silicon nitride film, a polyimide resin film, or the like.

A wiring film 19 of, for example, a material of aluminum series or the like is formed on the inter layer insulation film 18 for covering the layer insulating film 18 except the regions A and B and a region corresponding to specific one of the emitter electrode films 16 adjacent to the region A (the specific emitter electrode films being referenced with 16X in the drawing). The wiring film 19 is commonly connected to the emitter electrode films 16 except the specific emitter electrode film 16X through the respective through holes 18a. The wiring film 19 is formed so that the film thickness thereof is relatively thick and a suitable portion can be utilized as a bonding pad. Further, as shown in FIG. 5, a bonding pad 20 for the specific emitter electrode film 16X and an auxiliary wiring film 21 for connecting the bonding pad20 to the specific emitter electrode film 16X are formed at a portion of the layer insulation film 18 located at the region A.

In FIG. 2, the chip 11 further comprises a collector electrode film 22 formed on an entire rear surface of the substrate 12. The collector electrode film 22 is formed of, for example, an alloy composed of Cr-Ni-Ag.

Figure 6:
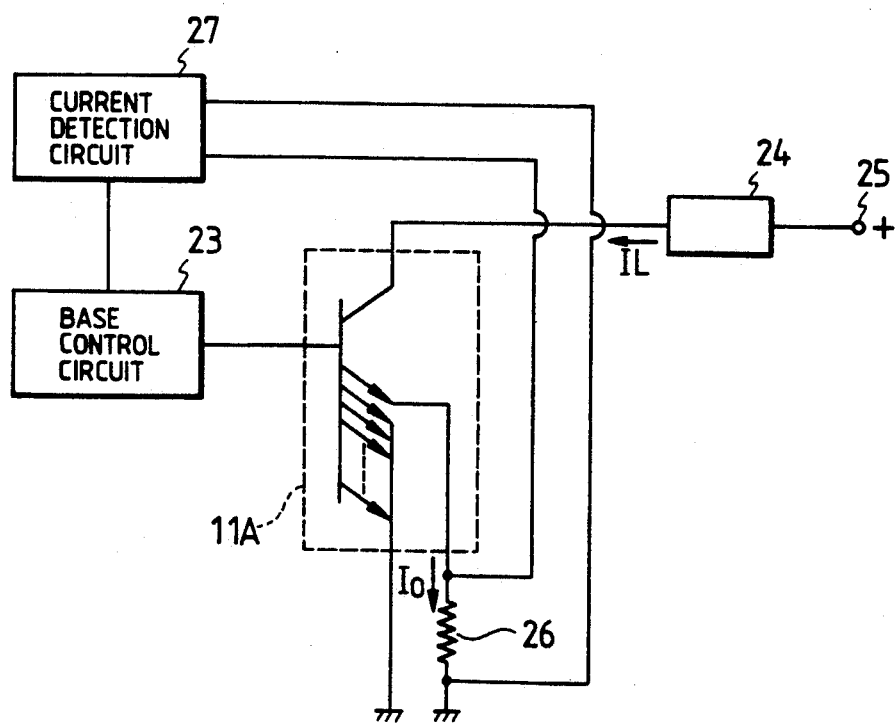
FIG. 6 is a circuit diagram showing an example of use.

FIG. 6 shows a specific example of use of a bipolar transistor 11A constituted by the thus configured chip 11 housed in a package, that is, a multi-emitter transistor 11A having forty-one emitters in total. This example illustrates a circuit configuration in which the transistor 11A can be protected from thermal breakdown due to an overload current. The transistor 11A is arranged to turn on/off on the basis of the control output of a base control circuit 23. A load 24 is supplied with a current from a power source terminal 25 through the collector and emitters of the transistor 11A. Therefore, a load current IL flowing in the load 24 flows through divided current paths constituted by the emitters (that is, the forty-one emitter electrode films 16).

A resistor 26 for detecting the load current IL is inserted in one of the above-mentioned current paths of the load 24 constituted by a specific one of the emitters corresponding to the above-mentioned specific emitter electrode film 16X. In this case, theoretically, a current $I_O$ flowing in the resistor 26 through the specific emitter is 1/41 as large as the load current IL because the transistor 11A is provided with the forty-one emitters in total. A current detection circuit 27 detects the load current IL (hence the collector current of the transistor 11A) by sampling a voltage across the resistor 26. The base control circuit 23 is arranged so that the transistor 11A is turned off in the condition where the detected current of the current detection circuit 27 exceeds a predetermined upper limit value $I_{max}/41$, so that the collector current of the transistor 11A is prevented from exceeding the upper limit value $I_{max}$.

In the foregoing configuration, since only a current which is 1/41 of the load current IL flows in the resistor 26 for detection of the load current IL, it is possible to make the power capacity and power loss of the resistor 26 small. Since the wiring film 19 and the base electrode film 17 are arranged to be double-layer wiring, the wiring film 19 can be formed to have a relatively thick film thickness and a large area and the base electrode film 17 may form to be like meshes of a large area.

As a result, the wiring capacity of the emitter wiring film 19 can be made extremely large so that the currents flowing in the emitters are made uniform to thereby improve the accuracy in current detection by use of the resistor 26. Since the wiring capacity of the base electrode film 17 is made remarkably large, the voltage drop across the base electrode film 17 is decreased.

Further, since the base electrode film 17 is formed so as to surround the emitter electrode films 16, the base-emitter voltages can be uniformly applied to the respective emitter electrode films 16 from the whole periphery thereof to thereby improve the efficiency in carrier injection of the emitters.

Moreover, being of the bipolar type, the transistor 11A is advantageous in that the withstanding breakdown voltage of the transistor 11A is high in comparison with an MOS-FET and the like and it is not necessary to provide an excessive over-voltage protection circuit or the like.

In the above embodiment, the transistor 11A and all or any of the base control circuit 23, the resistor 26, the current detection circuit 27, and the like may be formed in one integrated circuit in the form of one device.

Further, the present invention is not limited to the embodiment described above and illustrated in the drawings, but the embodiment may be modified in various ways without departing from the spirit or scope of the present invention. For example, the number of the emitter diffusion layers and the number of the emitter electrode films may be more increased.

What is claimed is:

1. An apparatus including a bipolar transistor of the multi-emitter type, comprising:
    a substrate having a first side and a second side;
    a base diffusion layer formed on said first side of said substrate;
    a plurality of emitter diffusion layers formed on said base diffusion layer in a planar array;
    a plurality of emitter electrode films formed respectively on said emitter diffusion layers;
    a base electrode film formed on said base diffusion layer;
    a collector electrode film formed on said second side of said substrate;
    a wiring film connecting more than one but less than all of said emitter electrode films;
    an inter-layer insulation film for covering said base electrode film;
    an auxiliary wiring film connected to said emitter electrode films not connected to said wiring film; and
    means, connected to said auxiliary wiring film, for measuring the current flowing through the emitter electrode films connected to said auxiliary wiring film, and for determining the current flowing through the emitter electrode films connected to said wiring film from the measured current flowing through the emitter electrode films connected to said auxiliary wiring film.

2. The bipolar transistor of claim 1, wherein said base electrode film has a mesh-like pattern with openings, and said emitter electrode films are centrally disposed within corresponding respective ones of said openings.

3. The bipolar transistor of claim 1, wherein said inter-layer insulation film is provided with through holes formed at portions thereof respectively corresponding to said emitter electrode films.

4. The bipolar transistor of claim 1, wherein said collector electrode film is formed on a rear surface of said substrate.

5. The bipolar transistor of claim 1, wherein said base electrode film is formed of a material of aluminum series.

6. The bipolar transistor of claim 1, wherein said inter-layer insulation film is formed of a silicon nitride film.

7. The bipolar transistor of claim 1, wherein said inter-layer insulation film is formed of a polyimide resin film.

8. The bipolar transistor of claim 1, wherein said wiring film is formed of a material of aluminum series.

9. A bipolar transistor of the multi-emitter type comprising:
    a substrate having a first side and a second side;
    a base diffusion layer formed on said first side of said substrate;
    a plurality of emitter diffusion layers formed on said base diffusion layer in a planar array;
    a plurality of emitter electrode films formed respectively on said emitter diffusion layers;
    a base electrode film formed on said base diffusion layer;
    a collector electrode film formed on said second side of said substrate, wherein said collector electrode film is formed of an alloy composed of Cr-Ni-Ag; and
    a wiring film connecting more than one but less than all of said emitter electrode films.

10. The bipolar transistor of claim 1, wherein the number of said emitter diffusion layers is forty-one.

11. The bipolar transistor of claim 1, wherein the number of said emitter diffusion layer is more than forty-one.

12. The bipolar transistor of claim 1, wherein said plurality of emitter diffusion layers have substantially the same surface area.

13. The bipolar transistor of claim 1, wherein said plurality of emitter diffusion layers are substantially identical.

* * * * *